(12) United States Patent
Nam

(10) Patent No.: US 6,396,350 B2
(45) Date of Patent: May 28, 2002

(54) POWER BOOSTER METHOD AND APPARATUS FOR IMPROVING THE PERFORMANCE OF RADIO FREQUENCY LINEAR POWER AMPLIFIERS

(75) Inventor: Ki Y. Nam, Laguna Niguel, CA (US)

(73) Assignee: Paradigm Wireless Systems, Inc., Irvine, CA (US)

(*) Notice: Subject to any disclaimer, the term of this patent is extended or adjusted under 35 U.S.C. 154(b) by 0 days.

(21) Appl. No.: 09/745,718

(22) Filed: Dec. 21, 2000

Related U.S. Application Data

(60) Provisional application No. 60/181,345, filed on Feb. 9, 2000, and provisional application No. 60/185,311, filed on Feb. 28, 2000.

(51) Int. Cl.$^7$ ................................................ H03F 3/04
(52) U.S. Cl. ...................................... 330/297; 330/149
(58) Field of Search ................................ 330/127, 149, 330/297

(56) References Cited

U.S. PATENT DOCUMENTS

| | | | |
|---|---|---|---|
| 3,753,138 A | 8/1973 | Svendsen | 330/297 |
| 3,818,361 A | 6/1974 | Gonda | 330/297 |
| 4,030,012 A | 6/1977 | Buhler | 330/207 P |
| 4,760,347 A | 7/1988 | Li et al. | 330/127 |
| 4,819,272 A | 4/1989 | Shimo et al. | 330/297 |
| 5,119,040 A | 6/1992 | Long et al. | 330/149 |
| 5,208,550 A | 5/1993 | Iwane | 330/129 |
| 5,291,147 A | 3/1994 | Muurinen | 330/136 |
| 5,334,979 A | 8/1994 | Hatakeyama | 330/129 |
| 5,469,105 A | 11/1995 | Sparks | 330/129 |
| 5,507,014 A | 4/1996 | Wray et al. | 455/426 |
| 5,507,016 A | 4/1996 | Okuhara | 455/126 |
| 5,515,008 A | 5/1996 | Ueda et al. | 455/126 |
| 5,524,285 A | 6/1996 | Wray et al. | 455/126 |
| 5,589,796 A | 12/1996 | Alberth, Jr. et al. | 455/126 |
| 5,604,462 A | 2/1997 | Gans et al. | 330/124 R |
| 5,642,378 A | 6/1997 | Denheyer et al. | 375/216 |
| 5,712,593 A | 1/1998 | Buer et al. | 330/129 |
| 5,724,005 A | 3/1998 | Chen et al. | 455/126 |
| 5,754,417 A | 5/1998 | Nicollini | 363/60 |
| 5,834,977 A | * 11/1998 | Maehara et al. | 330/297 |
| 5,886,575 A | 3/1999 | Long | 330/129 |
| 5,898,342 A | 4/1999 | Bell | 330/297 |
| 5,909,145 A | * 6/1999 | Zimmerman | 330/297 |
| 5,923,215 A | 7/1999 | Hans | 330/149 |
| 5,990,751 A | 11/1999 | Takita | 330/297 |
| 6,011,440 A | * 1/2000 | Bell et al. | 330/297 |
| 6,064,269 A | 5/2000 | Ruppel et al. | 330/297 |
| 6,069,530 A | 5/2000 | Clark | 330/149 |
| 6,081,161 A | 6/2000 | Dacus et al. | 330/297 |
| 6,163,706 A | * 12/2000 | Rozenblit et al. | 330/297 |
| 6,166,598 A | * 12/2000 | Schlueter | 330/127 |

* cited by examiner

Primary Examiner—Robert Pascal
Assistant Examiner—Khanh Van Nguyen
(74) Attorney, Agent, or Firm—Blakely, Sokoloff, Taylor & Zafman LLP

(57) ABSTRACT

Generally, the invention relates to a method and apparatus to improve the performance of radio frequency power amplifiers. More particularly, the present invention discloses the use of a power booster in conjunction with a radio-frequency linear power amplifier to reduce intermodulation distortion of an amplified signal.

17 Claims, 5 Drawing Sheets

POWER BOOSTER METHOD AND APPARATUS FOR IMPROVING THE PERFORMANCE OF RADIO FREQUENCY LINEAR POWER AMPLIFIERS

RELATED APPLICATION

This application claims the benefit of U.S. Provisional Patent Application No. 60/181,345 filed on Feb. 9, 2000 and U.S. Provisional Patent Application No. 60/185,311 filed on Feb. 28, 2000.

FIELD

The present invention relates generally to power amplifier systems, and more particularly to a method and apparatus to increase the linearity of radio frequency power amplifiers by minimizing intermodulation distortion.

BACKGROUND OF THE INVENTION

Communication services providers, such as cellular system operators, are subject to very strict bandwidth usage spectrum constraints imposed by the Federal Communications Commission (FCC). The FCC licenses transmission channels in the radio frequency spectrum and requires that signals be confined within certain emission limit masks in order to prevent interference caused by signals straying or spilling into adjacent transmission channels. The "emission mask" is a power spectrum density envelope. The maximum emitted power allowed varies as a function of the frequency offset from the nominal allocation center frequency. In other words, the emission mask determines the maximum power which may be emitted at a specific frequency for each frequency within the channel allocation. This requires that sideband spillover, the amount of energy outside the licensed channel, be sharply attenuated.

Meeting these emission mask requirements is specially difficult when implementing modern, digitally-based, modulation formats, such as Code Division Multiple Access (CDMA), or Time Division Multiple Access (TDMA). Attenuating the sidebands to meet FCC requirements using such modulation requires very linear signal processing systems and components. Designing linear components, and in particular power amplifiers, at radio frequencies is costly and challenging to achieve.

Radio-frequency (RF) linear power amplifiers (LPA) are typically used in digital cellular base stations to boost the power of a transmitted signal. RF power amplifiers for cellular communications typically operate in the Megahertz (MHz) and Gigahertz (GHz) frequency regions. Boosting a transmitted signal usually requires a LPA with a high ratio of peak-to-average power output (dynamic headroom), typically of at least 10 dB. The challenge is to design LPAs which can provide such dynamic headroom while minimizing sideband spillover without distorting the boosted signal.

Typically, conventional LPA designs have relied on increasing the number of additional RF power transistors in order to achieve the increasingly higher dynamic headroom required by newer implementations. However, using additional RF power transistors has the highly undesirable effect of raising the overall parts count, the manufacturing costs, and the DC current consumption of the LPA.

A fundamental problem in designing linear RF power amplifiers is that power amplifiers are inherently non-linear devices and generate unwanted intermodulation distortion (IMD)

Linearity refers to a characteristic of power amplifiers where there is a substantially constant (linear) gain between an input signal and an output signal. Typically, power amplifiers only exhibit linear gain for a range of input signal voltage levels. This range is often called the linear region of the power amplifier. If the input signal voltage is below the minimum voltage for the linear region or above the maximum voltage for the linear region, then intermodulation distortion occurs.

Intermodulation distortion manifests itself as spurious signals in the amplified RF output signal, separate and distinct from the RF input signal. IMD occurs when different frequencies from the input signal mix to produce sum and difference frequencies which did not exist in the input signal. It is the result of the behavior of amplifier components when operating outside the linear region.

Therefore, a linear RF power amplifier is desired which has substantially linear characteristics, minimizes both sideband spillover and intermodulation distortion, and does not increase the DC current consumption over conventional LPAs.

DETAILED DESCRIPTION OF THE INVENTION

Figure 1:
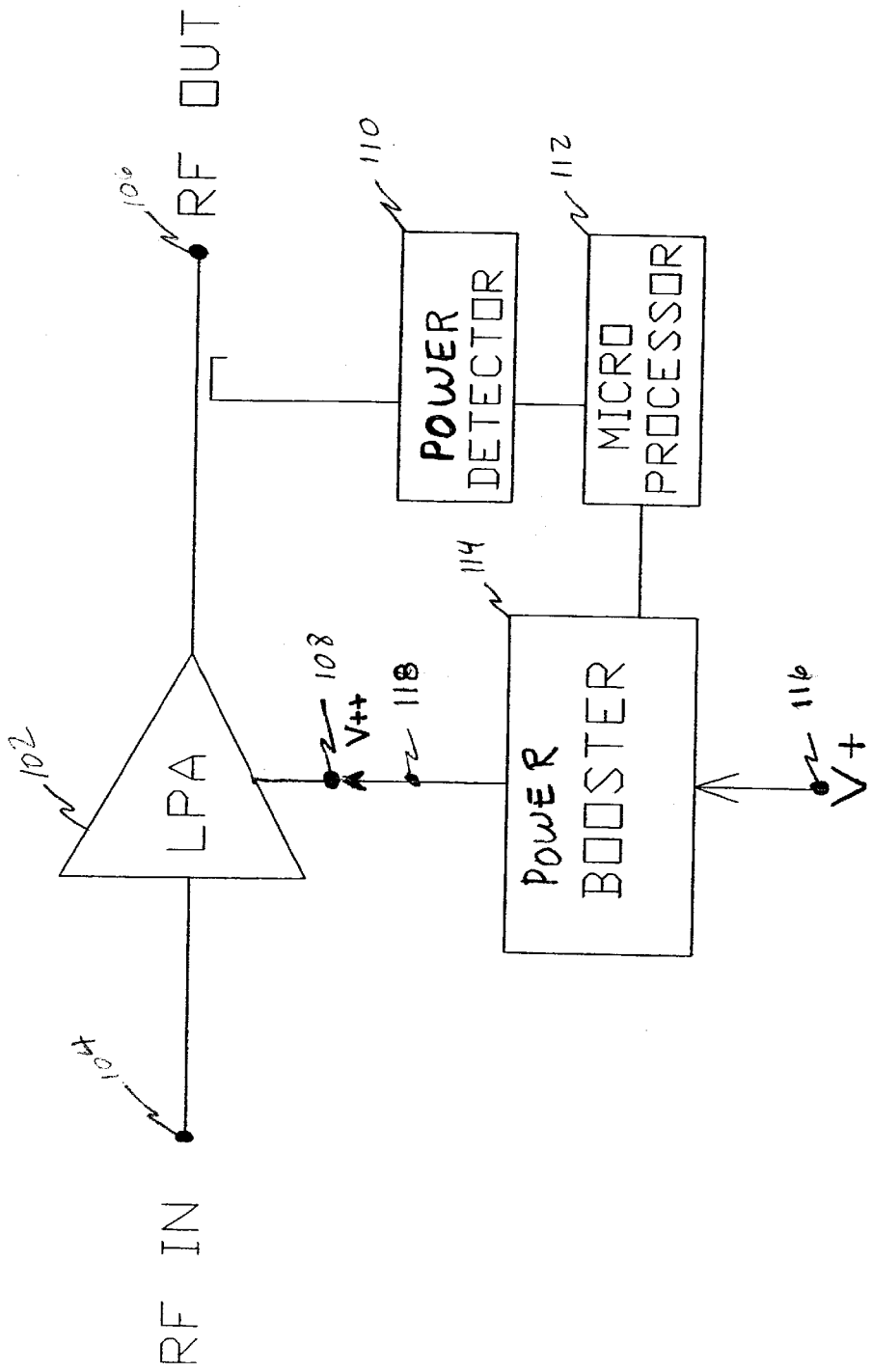
FIG. 1 is a system-level illustration of a first embodiment of the present invention to increase the linearity of the RF power amplifiers.

FIG. 1 is a first embodiment of the present invention disclosing a conventional RF linear power amplifier (LPA) 102 with a signal input port 104, a signal output port 106, and a supply voltage port 108. Also disclosed in FIG. 1 is a power detector 110 to sample the overall output power of the LPA 102 and coupled to a microprocessor 112. The microprocessor 112 is configured to instruct a power booster 114 to increase the DC voltage from a first port 116 to a second port 118 based on the output power measurement received by microprocessor 112 from the power detector 110. The second port 118 is then coupled to the supply voltage port 108 of the LPA 102. In one embodiment, the power detector 110 may be a root-mean-square power detector.

According to one embodiment of the invention, the power booster 114 may be capable of both increasing and decreasing the DC voltage from a first port 116 to a second port 118. Thus, the microprocessor 112 may also be configured to instruct the power booster 114 to increase or decrease the DC voltage. In one embodiment of the invention, the power booster may be adaptively and dynamically adjusted to provide a greater or lesser source voltage to the power amplifier.

In another embodiment of the invention, a machine-readable medium may contain instructions to adjust the power booster's configuration. That is, when the instructions in the machine-readable medium are executed by a processor, it causes the processor to configure the power booster to increase or decrease the source voltage to the power amplifier.

LPAs typically comprise RF power transistors configured to amplify a signal between an input port and an output port. Conventionally, cellular base stations supply a power source of +26 to +28 Volts DC to communication equipment within a base station. This limits the peak-to-average power output capability (dynamic headroom) an RF power amplifier may provide for transmissions.

According to one embodiment of the present invention, the LPA 102 may be comprised of one or more RF lateral diffusion metal oxide semiconductor (LDMOS) power transistors. One characteristic of MOS devices is that they behave like voltage-controlled current sources. Thus, the power output of a MOS device increases approximately as a factor of the square of the bias voltage. Consequently, raising the bias voltage of LDMOS transistors within an LPA increases their dynamic headroom thereby increasing their output linearity and improving the overall IMD performance of the LPA.

Figure 2:
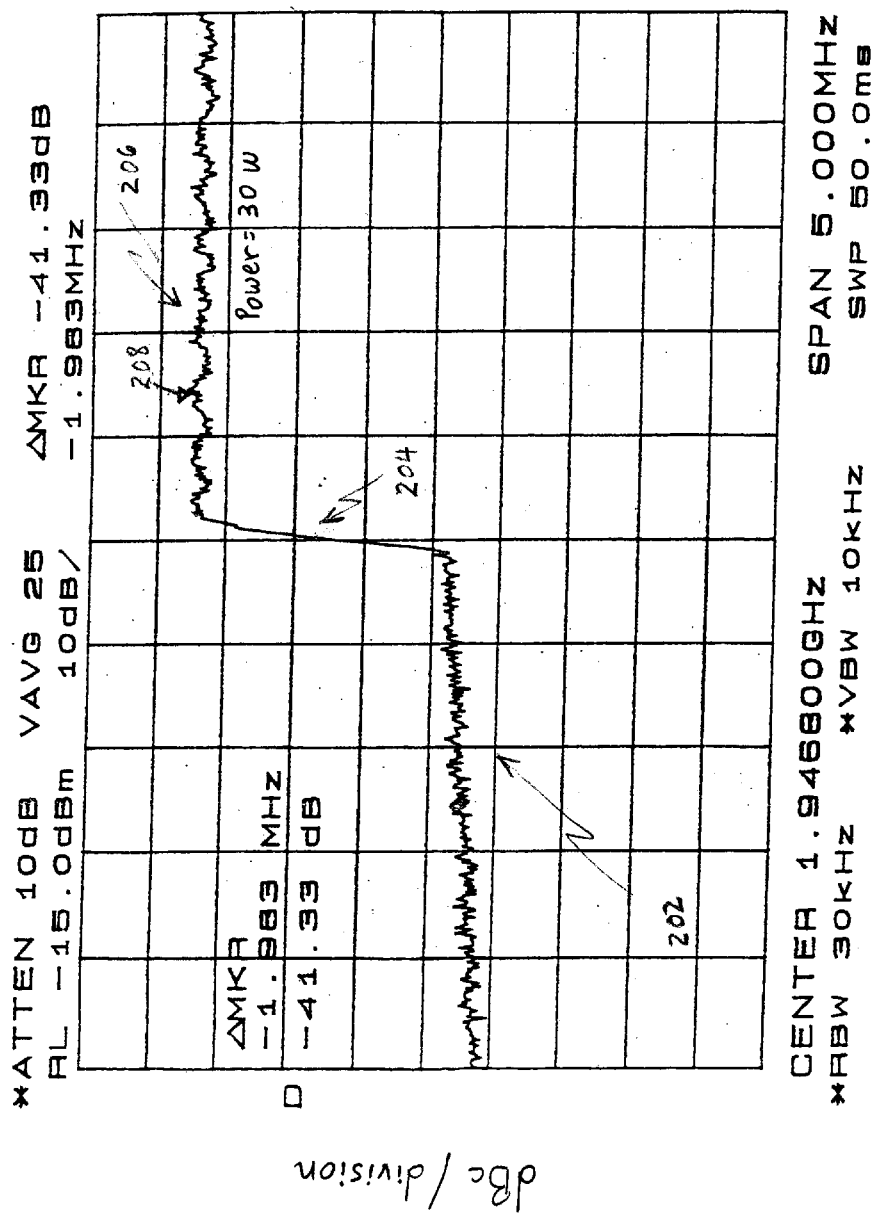
FIG. 2 illustrates the transfer characteristic of a linear power amplifier operating at 30 watts RF power output.

FIG. 2 illustrates the performance plot of a LPA, like that of FIG. 1, without the power booster circuit 114. For purposes of providing an example, a true CDMA modulated waveform or signal is depicted by the graph. However, the present invention is not limited to any particular transmission frequency, modulation scheme, or signal type. Thus, this particular graph and data thereon are not to be construed as limitations upon the present invention. In FIG. 2, the signal is illustrated at three different stages. The first region 202 depicts the un-amplified reference signal. The second region 204 shows the signal as it transitions from an un-amplified to amplified state. The third region 206 depicts the signal after it has been amplified by an LPA. At the third region 206, the signal power is 30 Watts with the LPA operating near its maximum power output. As measured at the marker 208, the signal is centered about 1.9468 GHz and has an IMD performance measured at −41.33 dBc.

Figure 3:
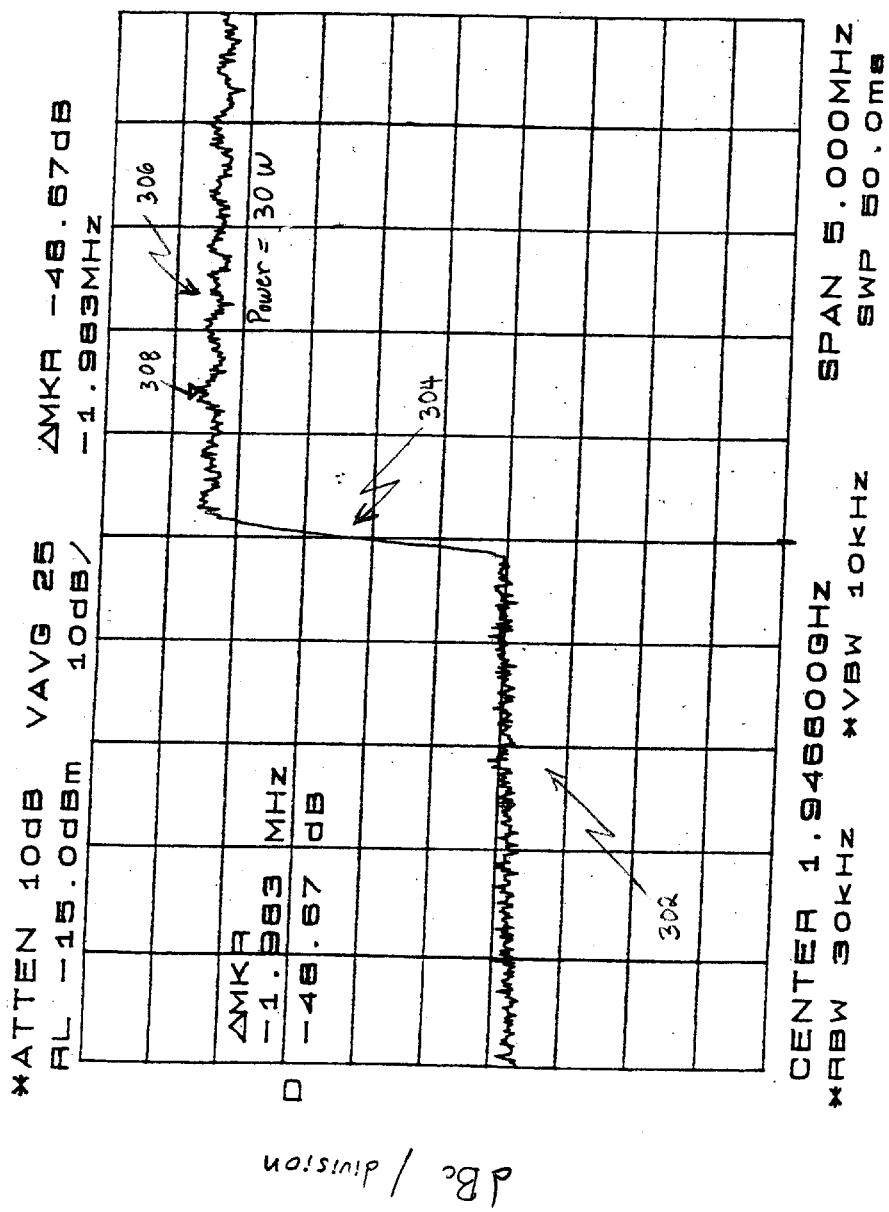
FIG. 3 illustrates the transfer characteristic of a linear power amplifier of operating at 30 watts RF power output and supplemented by the power booster of the present invention.

FIG. 3 illustrates the performance plot of a LPA, like that of FIG. 1, including the power booster circuit 114. As with FIG. 2, a true CDMA modulated waveform is depicted by the graph. The first region 302 depicts the un-amplified reference signal. The second region 304 shows the signal as it transitions from an un-amplified to an amplified state. The third region 306 depicts the signal after it has been amplified by an LPA supplemented by the power booster 114. At the third region 306, the signal power is 30 Watts. As measured at the marker 308, the signal is centered about 1.9468 GHz and has an improved IMD performance measured at −48.67 dBc. This is an improvement of 7 dB over the LPA without the power booster shown in FIG. 2.

Thus, a setup as shown in FIG. 1 may be used to boost the voltage to LPAs in existing cellular stations thereby achieving the desired reduction in the IMD of the amplified signal. In various embodiments of the invention, the power booster 114 (FIG. 1) may increase the source voltage (V+ in FIG. 1) by an additional 1 to 20 volts to achieve the desired improvement in IMD. In one embodiment of the invention, the power booster 114 (FIG. 1) increases the source voltage (V+ in FIG. 1) by an additional 2 to 15 volts.

A power booster may be designed in numerous conventional configurations known to those of ordinary skill in the art. For example, in one embodiment the power booster may comprise a DC-to-DC converter capable of boosting or reducing a voltage from a first port to a second port.

Figure 4:
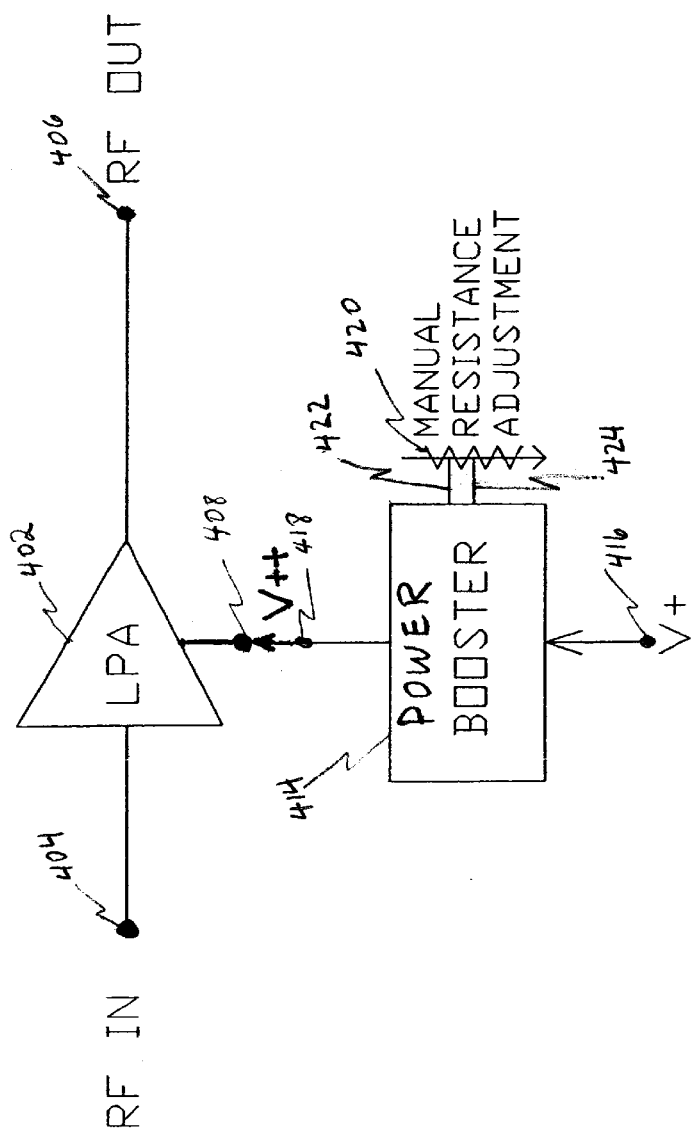
FIG. 4 is a system-level illustration of a second embodiment of the present invention to increase the linearity of the RF power amplifiers.

FIG. 4 illustrates another embodiment of the present invention, with an input port 404 to receive a signal, a conventional LPA 402 to amplify the input signal, and an output port 406 to provide the amplified signal. The LPA 402 is coupled to a power booster 414 which is in turn coupled to a voltage source (V+) via a first port 416. The power booster 414 acts to raise the voltage (V+) from the first port 416 and supply an increased voltage (v++) to the supply voltage port 408 of the LPA 402. As previously noted, the increased voltage serves to reduce the IMD of the amplified signal observed at the output port 406 of the LPA 402.

To configure the power booster 414, the power booster 414 comprises a third port 422 and a fourth port 424.

According to one embodiment of the invention, the output voltage (V++) of the power booster 414 may be set by a resistive load 420 between the third port 422 and the fourth port 424. In one embodiment of this invention, the resistive load 420 may be a manually adjustable impedance component such as a potentiometer. For a given resistive value between the third port 422 and the fourth port 424, the amount that the DC voltage output (V++) increases over the DC voltage input (V+) will remain fixed.

In one embodiment of the invention, the power booster 414 detects the voltage differential between the third port 422 and the fourth port 424 in order to set its DC voltage output (V++). In another embodiment, the power booster 414 sets its DC voltage output (V++) by measuring the current through the resistive load 420 between third port 422 and the fourth port 424.

Figure 5:
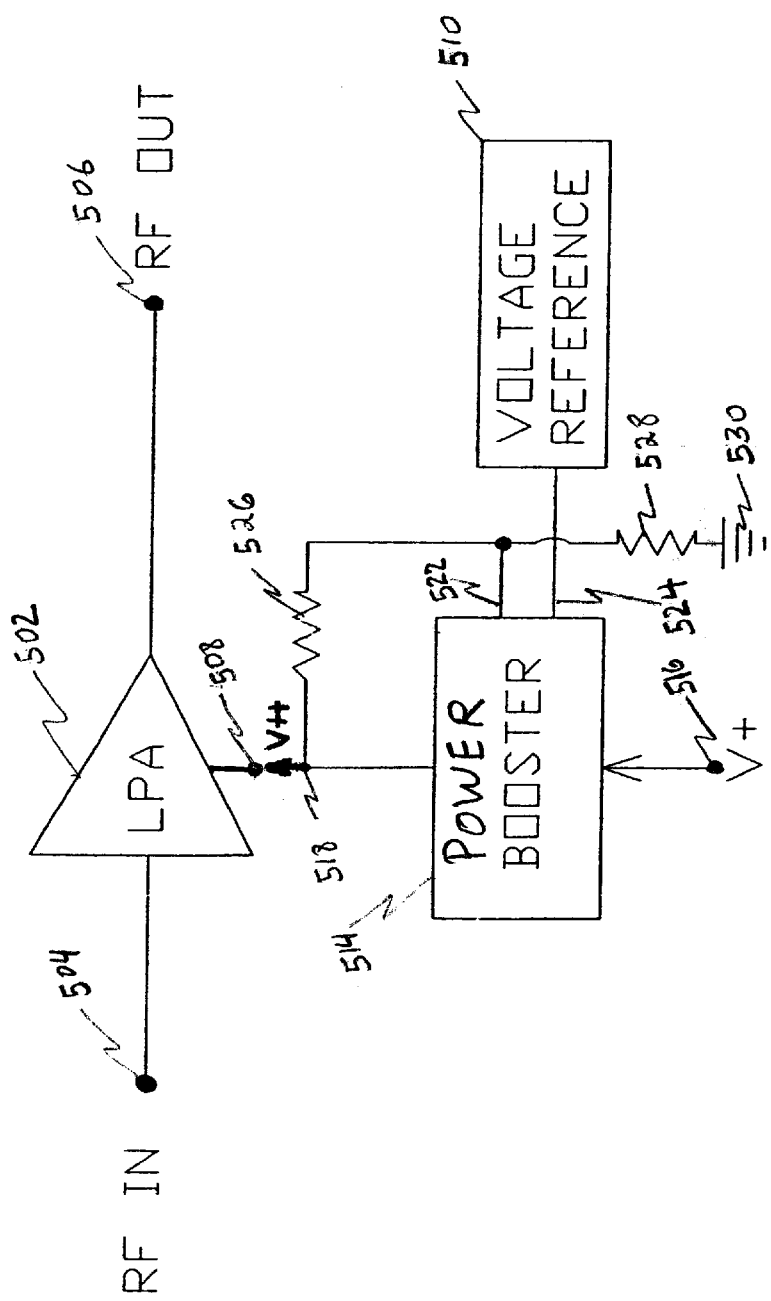
FIG. 5 is a system-level illustration of a third embodiment of the present invention to increase the linearity of the RF power amplifiers.

FIG. 5 illustrates another embodiment of the present invention. The DC output voltage (V++), at a second port 518 of the power booster 514, is fixed and constant even when the DC input voltage (V+), at a first port 516, may vary. The power booster 514 may regulate the DC output voltage (V++) at the second port 518 by comparing the voltage at a third port 522 to a reference voltage at a fourth port 524. The voltage present at the third port 522 is the result of a voltage divider formed by a first resistor 526, coupled between DC voltage output port 518 and the third port 522, and a second resistor 528, coupled between the third port 522 and ground 530. A reference voltage 510 is coupled to the fourth port 524 of the power booster 514. By comparing the reference voltage at the fourth port 524 and the voltage at the third port 522, the power booster 514 may be instructed to hold its DC output voltage (V++), at the second port 518, to a predetermined constant value. The predetermined constant value may be directly proportional to the reference voltage 510 coupled to the fourth port 524.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A method of amplifying CDMA signals in a cellular base station to provide a power amplifier output with reduced intermodulation distortion comprising:

providing a power amplifier having one or more RF lateral diffusion metal oxide semiconductor power transistors;

coupling an input of the power amplifier to an CDMA RF input signal;

coupling the power amplifier to a voltage booster to power the power amplifier from the voltage booster;

powering the voltage booster from a source of power of a predetermined voltage;

the voltage booster having the capability of providing power to power the power amplifier at voltages that are greater or less than the predetermined voltage responsive to a booster control input;

detecting the output of the power amplifier; and, providing the booster control input to the voltage booster responsive to the detected output of the power amplifier to control the voltage powering the power amplifier responsive to the output of the power amplifier.

2. The method of claim 1 wherein the predetermined voltage is 27 volts.

3. The method of claim 2 wherein boosting the voltage source power comprises boosting the voltage source by as much as 1 to 15 Volts.

4. The method of claim 2 wherein boosting the voltage source power comprises boosting the voltage source by as much as 2 to 8 Volts DC.

5. The method of claim 2 wherein boosting of the voltage source power is done only when the power amplifier is operating within twenty percent of its maximum power output.

6. The method of claim 1 wherein detecting the output of the power amplifier comprises detecting the output of the power amplifier using a root-mean-square power detector.

7. A method of amplifying CDMA signals in a cellular base station to provide a power amplifier output with reduced intermodulation distortion comprising:

providing a power amplifier having one or more RF lateral diffusion metal oxide semiconductor power transistors;

coupling an input of the power amplifier to an CDMA RF input signal;

coupling the power amplifier to a voltage booster to power the power amplifier from the voltage booster;

powering the voltage booster from a source of power of a predetermined voltage;

the voltage booster having the capability of providing power to power the power amplifier at voltages that are greater than the predetermined voltage responsive to a booster control input;

detecting the output of the power amplifier; and, providing the booster control input to the voltage booster responsive to the detected output of the power amplifier to control the voltage powering the power amplifier responsive to the output of the power amplifier.

8. The method of claim 7 wherein the predetermined voltage is 27 volts.

9. The method of claim 8 wherein boosting the voltage source power comprises boosting the voltage source by as much as 1 to 15 Volts.

10. The method of claim 8 wherein boosting the voltage source power comprises boosting the voltage source by as much as 2 to 8 Volts DC.

11. The method of claim 8 wherein boosting of the voltage source power is done only when the power amplifier is operating within twenty percent of its maximum power output.

12. The method of claim 7 wherein detecting the output of the power amplifier comprises detecting the output of the power amplifier using a root-mean-square power detector.

13. A method of amplifying CDMA signals in a cellular base station to provide a power amplifier output with reduced intermodulation distortion comprising:

providing a power amplifier having one or more RF lateral diffusion metal oxide semiconductor power transistors;

coupling an input of the power amplifier to an CDMA RF input signal;

coupling the power amplifier to a voltage booster to power the power amplifier from the voltage booster;

powering the voltage booster from a source of power of a predetermined voltage;

the voltage booster providing power to power the power amplifier at a voltage that is greater than the predetermined voltage.

14. The method of claim 13 wherein the predetermined voltage is 27 volts.

15. The method of claim 14 wherein boosting the voltage source power comprises boosting the voltage source by 1 to 15 Volts.

16. The method of claim 14 wherein boosting the voltage source power comprises boosting the voltage source by 2 to 8 Volts DC.

17. The method of claim 14 wherein boosting of the voltage source power is done only when the power amplifier is operating within twenty percent of its maximum power output.

* * * * *